United States Patent
Uchida

(10) Patent No.: US 7,693,205 B2
(45) Date of Patent: Apr. 6, 2010

(54) SURFACE EMITTING LASER

(75) Inventor: Tatsuro Uchida, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 93 days.

(21) Appl. No.: 12/098,777

(22) Filed: Apr. 7, 2008

(65) Prior Publication Data

US 2008/0298418 A1    Dec. 4, 2008

(30) Foreign Application Priority Data

May 7, 2007   (JP)   ............... 2007-122827

(51) Int. Cl.
*H01S 5/00* (2006.01)
(52) U.S. Cl. ............... 372/50.124; 372/50.11
(58) Field of Classification Search ............. 372/50.124
See application file for complete search history.

(56) References Cited

U.S. PATENT DOCUMENTS 6,154,480 A    11/2000   Magnusson et al.
7,120,325 B1   10/2006   Uchida
7,483,469 B2 * 1/2009    Mochizuki ............. 372/50.124

* cited by examiner

*Primary Examiner*—Armando Rodriguez
(74) *Attorney, Agent, or Firm*—Fitzpatrick, Cella, Harper & Scinto

(57) ABSTRACT

A vertical cavity surface emitting laser capable of efficiently injecting carries into an active region directly under a photonic crystal mirror is provided. The vertical cavity surface emitting laser includes a first reflective mirror 102 constituting a lower mirror, a second reflective mirror 112 constituting an upper mirror, and an active layer 106 provided between the reflective mirrors on a substrate 100. The second reflective mirror 112 includes a periodic refractive index structure periodically arranged in a plane parallel to a surface of the substrate, which structure is composed of a first medium 1100 having conductivity and a second medium 1102 having a refractive index lower than that of the first medium 1100. A layer structure by a third medium 1104 having a refractive index lower than that of the first medium 1100 is embedded in the first medium 1100 on the lower side of the periodic refractive index structure.

19 Claims, 7 Drawing Sheets

500

502

504

SURFACE EMITTING LASER

BACKGROUND OF THE INVENTION

1. Field of the Invention

The present invention relates to a vertical cavity surface emitting laser.

2. Description of the Related Art

As a configuration of a surface emitting laser, a vertical cavity surface emitting laser is known in which the active region thereof is put between two reflective mirrors arranged on both sides thereof to form a resonator in the direction vertical to the substrate surface thereof and to emit a light into the vertical direction from the substrate surface.

Because the vertical cavity surface emitting laser has the following many technological advantages, the vertical cavity surface emitting laser has been actively researched.

That is, this surface emitting laser operates with a low threshold and low power consumption and is also arranged to emit a circular spot light so that the laser can be easily coupled with an optical element to form an array therewith.

However, on the other hand, it is difficult for the surface emitting laser to obtain a gain necessary for oscillation because the active region thereof is small.

Accordingly, high reflectivity equal to or more than 99% is required for a pair of distributed Bragg reflector (hereinafter referred to as a DBR mirror) constituting the resonator.

In order to realize the high reflectivity, several tens of stacked layers are needed in the case of a semiconductor mirror.

Due to the layer thickness of the stacked layers, the surface emitting laser has the problems of heat easily filled in the resonator, the large threshold, and the increasing electric resistance thereof which makes current injection therein difficult.

As a resonator mirror that can be replaced with such a DBR, a first non-patent document (V. Lousse et al.: Opt. Express 12 (2004) 1575) reports the wavelength dependency of a reflected light and a transmitted light in the case of using a slab-type two dimensional photonic crystal as a mirror.

The photonic crystal is a structure in which a refractive index variation of the order of a wavelength of light is artificially formed, that is, a periodic refractive index structure in which media having different refractive indices from one another are periodically arranged.

The technique disclosed in the first non-patent document periodically forms holes in a material having a high refractive index to form an air hole (hole) type two dimensional photonic crystal as a two dimensional photonic crystal.

Then, it is reported that the light having a predetermined frequency is reflected from a plane of the two dimensional photonic crystal at the efficiency of almost 100% if the light is made to enter the plane from the direction almost vertical thereto.

A reflective mirror of the vertical cavity surface emitting laser can be formed of a very thin film by using such a two dimensional (or one dimensional) photonic crystal as the reflective mirror in a vertical arrangement to the resonance direction of a light.

That is, the reflective mirror, which has been conventionally formed of a thick multilayer film of the order of about several μm, can be formed of a very thin film of the order from several tens nm to several hundreds nm.

Consequently, the problems such as the difficulty of heat radiation and the electric resistance caused by the layer thickness of the reflective mirror can be decreased.

In the following, such a reflective mirror will be referred to as a photonic crystal mirror.

A second non-patent document (H. T. Hattori et al.: Opt. Express 11 (2003) 1799) discloses a numerical calculation example of a surface emitting laser structure that configures a resonator by combining the one dimensional photonic crystal mirror with a DBR mirror as an actual surface emitting laser device.

To put it concretely, as illustrated in FIG. 2, the calculation was performed assuming that the layers (cladding layers) above and below the layer (core layer) formed in a periodic refractive index structure were air layers.

A region 206 on the lower side in FIG. 2 is called as an air gap layer. In FIG. 2, the surface emitting laser structure includes a semiconductor substrate 200, a DBR mirror 202, an active layer 204, the air gap layer (cladding layer) 206, a photonic crystal mirror (core layer) 208, and holes 210.

However, in the configuration of the element of the second non-patent document shown in FIG. 2 thereof, because the air gap layer 206 is formed directly under the photonic crystal mirror 208, it is difficult to inject carriers into the active region 204 arranged directly under the photonic crystal mirror 208 when the element is driven by current injection.

SUMMARY OF THE INVENTION

It is an aspect of the invention to provide a vertical cavity surface emitting laser capable of efficiently injecting carriers into an active region arranged directly under a photonic crystal mirror in order to form a reflective mirror of a surface emitting laser with the photonic crystal mirror.

A vertical cavity surface emitting laser according to the present invention includes: a first reflective mirror constituting a lower mirror; a second reflective mirror constituting an upper mirror; an active layer formed between the first and the second reflective mirrors; and a substrate, on which the first and the second reflective mirrors and the active layer are formed, wherein the second reflective mirror has a periodic refractive index structure, in which a first medium having conductivity and second medium having a refractive index lower than that of the first medium is periodically provided in a direction parallel to a surface of the substrate, and a layer structure made of a third medium having a refractive index lower than that of the first medium is embedded in the first medium on a lower side of the periodic refractive index structure.

According to the present invention, a vertical cavity surface emitting laser can be realized in which carriers can be efficiently injected into an active region arranged directly under a photonic crystal mirror in order to form a reflective mirror of the surface emitting laser with the photonic crystal mirror.

Further features of the present invention will become apparent from the following description of exemplary embodiments with reference to the attached drawings.

BRIEF DESCRIPTION OF THE DRAWINGS

FIGS. 3A and 3B are schematic views for describing the configuration of a vertical cavity surface emitting laser of a first embodiment of the present invention, in which FIG. 3A is a schematic sectional view in the direction vertical to a substrate of the vertical cavity surface emitting laser of the first embodiment and FIG. 3B is a schematic plan view of an upper resonator mirror when the upper resonator mirror is viewed from the direction vertical to the surface of the mirror.

DESCRIPTION OF THE EMBODIMENTS

Next, vertical cavity surface emitting lasers of exemplary embodiments of the present invention will be described.

Figure 1:
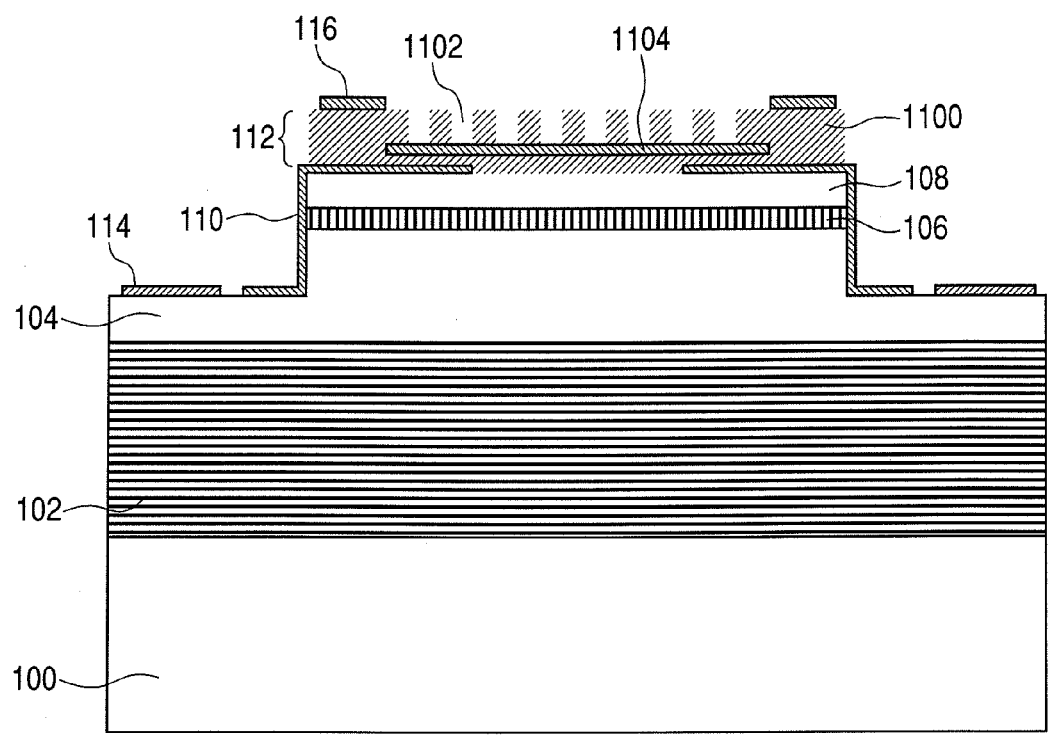
FIG. 1 is a schematic sectional view illustrating the basic configuration of a vertical cavity surface emitting laser of an exemplary embodiment of the present invention.
Figure 2:
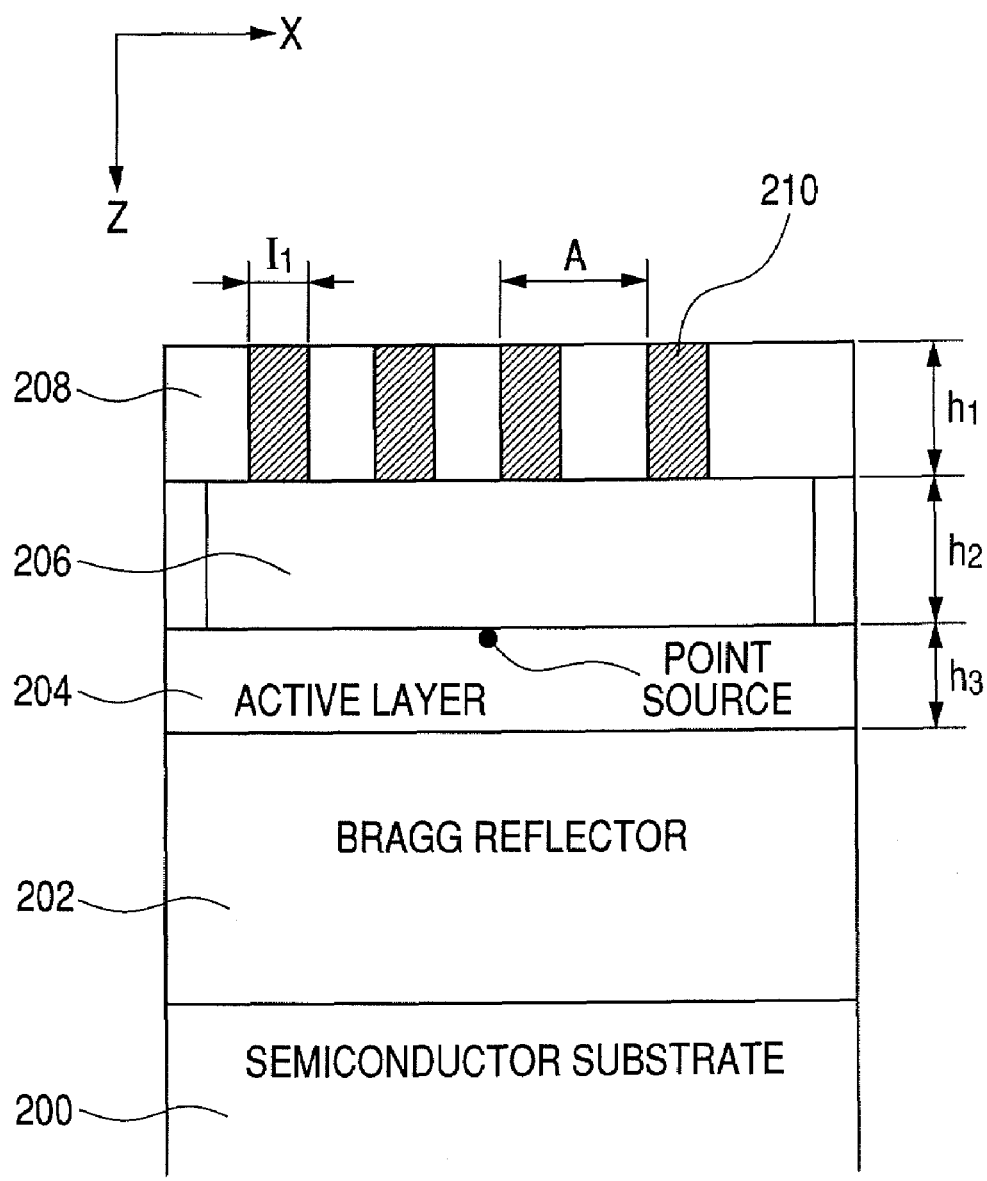
FIG. 2 is a schematic sectional view illustrating the basic configuration of a vertical cavity surface emitting laser disclosed in the second non-patent document.

FIG. 1 illustrates a schematic sectional view of the vertical cavity surface emitting laser of the present exemplary embodiment.

As illustrated in FIG. 1, the vertical cavity surface emitting laser includes a substrate 100, a first reflective mirror 102, a first cladding layer 104, an active layer 106, a second cladding layer 108, an insulation layer (current confinement layer) 110, a second reflective mirror 112, a first electrode 114, and a second electrode 116.

The vertical cavity surface emitting laser of the present exemplary embodiment includes the first reflective mirror 102 constituting a lower mirror, the second reflective mirror 112 constituting an upper mirror, the active layer 106 formed between the first and the second reflective mirrors 102 and 112, and the substrate 100, on which the first and the second reflective mirrors 102 and 112 and the active layer 106 are formed.

Moreover, the second reflective mirror 112 is configured of the following slab-type two dimensional photonic crystal mirror.

That is, the second reflective mirror 112 has a periodic refractive index structure (photonic crystal structure) including a first medium 1100 having conductivity and second medium 1102 having a refractive index lower than that of the first medium 1100. The second medium 1102 is periodically provided in the plane parallel to a surface of the substrate 100.

As described above, because the second reflective mirror 112 is made of the medium 1100 having the conductivity in the embodiment of the present invention, carrier injection can be easily performed.

A layer structure made of a third medium 1104 having a refractive index lower than that of the first medium 1100 is then arranged to be embedded in the first medium 1100 under a lower side of the periodic refractive index structure.

Because the refractive index of the third medium 1104 is lower than that of the first medium 1100, the periodic refractive index structure is made to be an optical confinement structure. That is, the periodic refractive index structure functions as a core layer, and the third medium 1104 functions as a cladding layer.

Moreover, the third medium 1104 constituting the refractive index structure is preferably configured of a material having a refractive index lower than that of the first medium 1100 by 10% or more.

The first medium 1100 is made of a material that is transparent to the light emitted from the active layer 106 and has the conductivity. As the material of the first medium 1100, indium tin oxide (ITO), indium zinc oxide (IZO), stannic oxide, zinc oxide, and the like, can be cited.

Moreover, the second medium 1102 is made of a material transparent to the light emitted from the active layer 106. As the materials of the second medium 1102, air (holes) can be cited. Moreover, the second medium 1102 may be formed by embedding silicon nitride, magnesium fluoride, or the like.

Incidentally, the second medium 1102 may be formed of materials having conductivity. In this case, the carriers injected from the first medium 1100 can be injected into a semiconductor layer through the second medium 1102, and thus more efficient carrier injection is enabled.

Moreover, the third medium 1104 is made of a material transparent to the light emitted from the active layer 106. As the material of the third medium 1104, either of a conductive material and an insulating material can be used.

As the material of the third medium 1104, silicon oxide, silicon nitride, magnesium fluoride, stannic oxide, and the like, can be cited.

Next, the principle of applying a two dimensional photonic crystal slab as a reflective mirror is described.

The slab-type two dimensional photonic crystal of the present exemplary embodiment functions as a mirror by means of the guided resonance (GR) effect.

The GR effect means the phenomenon in which, if a light enters the slab-type two dimensional photonic crystal from the direction vertical to the slab surface thereof, then the light of a predetermined frequency is reflected at the efficiency of almost 100%.

That is, the GR effect is caused by the resonance of a mode for guiding waves through the slab-type two dimensional photonic crystal with a specific radiation mode.

Moreover, it can be also possible to adopt the configuration that introduces a part (defect) disturbing the periodic structure into the periodic refractive index structure formed in the present exemplary embodiment as a part thereof.

It is enabled to control the oscillation mode and the polarization mode of the slab-type two dimensional photonic crystal by the formation of such defect.

Moreover, in this configuration, a level caused by the defect is formed in the photonic band of the configuration due to introducing the defect, and the light entering the two dimensional photonic crystal mirror resonates only in the mode caused by the defect level in the plane parallel to the surface of the substrate, so that a single mode is attained.

The single mode light is emitted into the vertical direction on the incident light side, and resonates between the two upper and lower mirrors (at least one of them is the slab-type two dimensional photonic crystal mirror) arranged to put the active layer between them to finally emit a coherent light of a surface emitting laser.

At this time, a single mode light having a large spot diameter can be obtained by the coupling of the spatially localized single mode lights.

The property described above can be found not only in the two dimensional photonic crystal but also in a one dimensional photonic crystal.

The configuration of the two dimensional photonic crystal is generally the one in which low refractive index medium is periodically provided in a high refractive index medium.

In this case, the configurations in which the low refractive index medium is arranged in a form of triangular lattice, a quadrilateral lattice, a honeycomb lattice and the like were reported. The reflection property of the mirror can be controlled by changing the periodicity or the volume of the low refractive index medium.

Furthermore, the reflection property can be also controlled by adjusting the thickness of the photonic crystal in the direction vertical to the periodic refractive index structure thereof.

Incidentally, the thickness is preferably set so that the transverse mode of the light propagating through the photonic crystal in the two dimensional plane does not become multi-mode.

Moreover, the configuration in which the low refractive index media and the high refractive index medium are replaced with each other in the configuration described above can be also adopted.

Moreover, in the present exemplary embodiment, the configuration may be adopted in which the first reflective mirror 102 is composed of a distributed Bragg reflective mirror and the second reflective mirror 112 is composed of a one dimensional or two dimensional slab type photonic crystal made of the periodic refractive index structure.

EXEMPLARY EMBODIMENTS

In the following, the exemplary embodiments of the present invention will be described.

First Embodiment

In a first embodiment, a vertical cavity surface emitting laser configured by the application of the present invention is described.

Figure 3A:
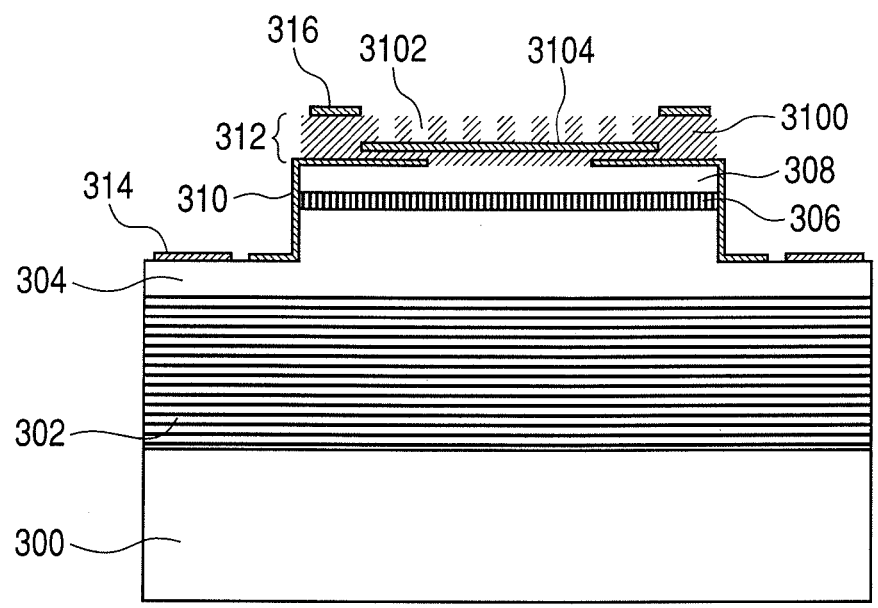
Figure 3B:
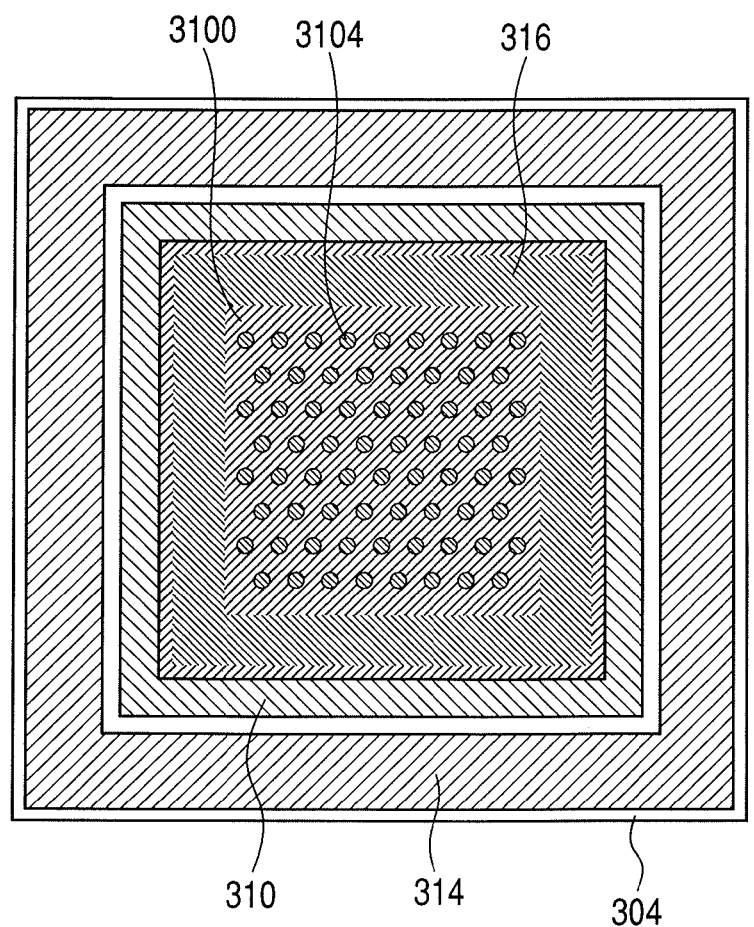

FIGS. 3A and 3B are schematic views illustrating the configuration of the vertical cavity surface emitting laser of the present embodiment. FIG. 3A illustrates a schematic sectional view of the vertical cavity surface emitting laser of the present embodiment in the direction vertical to the substrate thereof.

Moreover, FIG. 3B illustrates a schematic plan view of an upper resonator mirror when it is viewed from the direction vertical to the surface thereof.

As illustrated in FIGS. 3A and 3B, the vertical cavity surface emitting laser includes a sapphire substrate 300, an AlGaN/GaN DBR mirror 302, an n type GaN cladding layer 304, an InGaN/GaN multi quantum well (MQW) active layer 306, and a p type GaN/AlGaN cladding layer 308.

The vertical cavity surface emitting laser further includes a silicon oxide layer 310, a slab-type two dimensional photonic crystal mirror 312 (composed of an ITO layer 3100, holes 3102, and a silicon oxide layer 3104), an n side electrode 314, and a p side electrode 316.

The vertical cavity surface emitting laser of the present embodiment is arranged so that the loops of a standing wave formed in the resonator may be formed at the position of the active layer 306, and the boundaries of each of the cladding layers 304 and 308, and the upper and lower mirrors (the DBR mirror 302 and the slab-type two dimensional photonic crystal mirror 312).

Moreover, in the present embodiment, an $Al_{0.25}Ga_{0.75}N$/GaN (60 pairs) DBR mirror in which high refractive index medium having ¼ wavelength thickness and low refractive index medium having ¼ wavelength thickness are alternately stacked is used as the first reflective mirror.

Moreover, a slab-type two dimensional photonic crystal mirror 312 according to the present exemplary embodiment is used as the second reflective mirror.

Next, the slab-type two dimensional photonic crystal mirror 312 of the present embodiment is described.

The ITO layer 3100 (having refractive index: 2.2), which is a transparent conductive layer, is formed on the uppermost layer of a semiconductor stacked structure grown on the substrate 300. A periodic refractive index structure produced by forming the holes 3102 in the ITO layer 3100 is formed so that the top surface of the ITO layer 3100 contacts with the air.

Moreover, the periodic refractive index structure is arranged so that the under surface thereof contacts with the silicon oxide layer 3104 having a refractive index (equal to 1.5) smaller than that of the ITO layer 3100.

The wave guiding of a light through the layer in which the periodic refractive index structure is formed can be efficiently attained by adopting such a configuration.

Each of the holes 3102 has a columnar shape of 40 nm in radius and 130 nm in depth here.

Moreover, the holes 3102 are arranged in a form of triangular lattice of the lattice constant of 240 nm.

Moreover, the thickness of the silicon oxide layer 3104 is made to be 100 nm.

The periodic refractive index structure (photonic crystal) region formed in the present embodiment is formed in a form of a regular square having the sides, each having the length of 20 μm.

The slab-type two dimensional photonic crystal of the present embodiment functions as a mirror by means of the GR effect described above.

In the present embodiment, the p side electrode 316 is formed in a ring around the periodic refractive index structure (photonic crystal) formed on the ITO layer 3100 which is the uppermost surface.

The carriers injected from the electrode 316 are injected into the semiconductor layer though the ITO layer 3100, and thereby the active layer 306 emits a light.

Moreover, in the present embodiment, the silicon oxide layer 310 is formed between the second reflective mirror (slab-type two dimensional photonic crystal mirror 312) and the p type cladding layer (p GaN/AlGaN) 308, and a part of the silicon oxide layer 310 is removed to form the current confinement layer. Thereby, the carriers pass between the silicon oxide layer 3104 and the silicon oxide layer 310 to be injected to the central part of the active layer 306. Thus, the configuration in which single transverse mode oscillations easily occur is provided. By means of such a configuration, the current confinement structure can be formed in a GaN system laser, in which no oxide confinement structures can be produced.

Incidentally, the present embodiment supposes to apply the present invention to the GaN system laser. But, if the present invention is applied to a GaAs system laser or the like, then the current confinement may be realized by using the oxide confinement structure formed by the vapor oxidation of AlGaAs or the like including much Al composition.

Next, a manufacturing method of the vertical cavity surface emitting laser of the present exemplary embodiment will be described.

Schematic views for describing the manufacturing method of the surface emitting laser of the present exemplary embodiment are illustrated in FIGS. 4A to 6C.

Figure 4A:
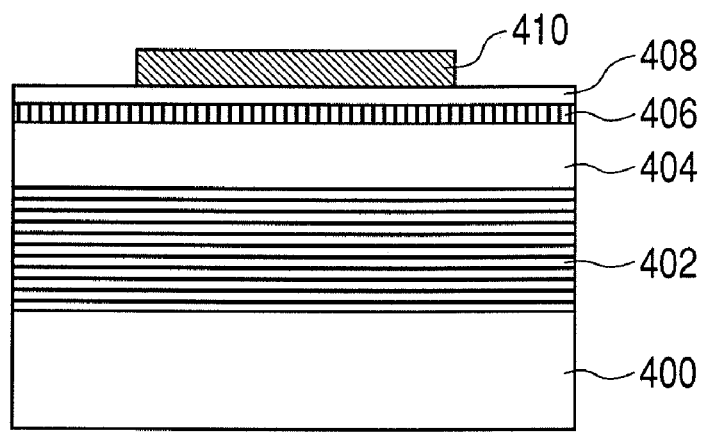
FIGS. 4A, 4B, and 4C are schematic views for describing a manufacturing method of the vertical cavity surface emitting laser of the first embodiment of the present invention, each view describing each part of the manufacturing process of the manufacturing method of the vertical cavity surface emitting laser.
Figure 4B:
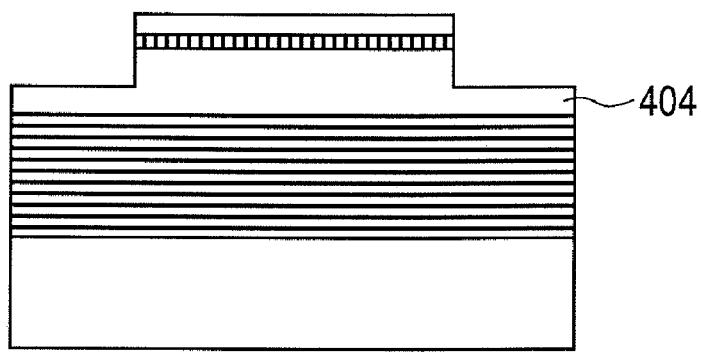
Figure 4C:
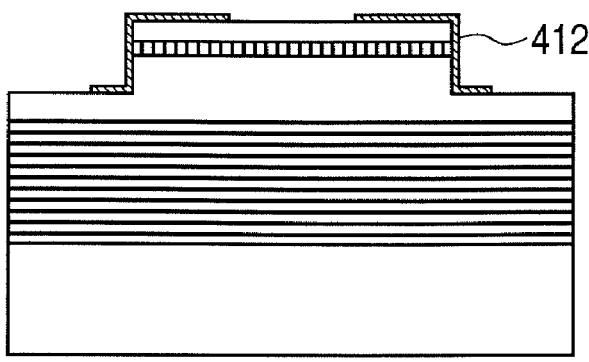

FIGS. 4A to 4C are views for describing a part of the manufacturing process of the manufacturing method of the vertical cavity surface emitting laser.

Figure 5A:
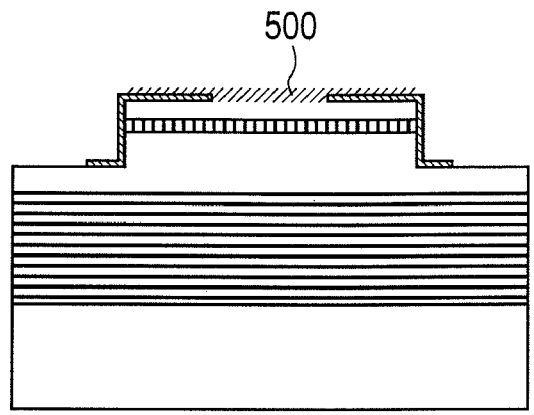
FIGS. 5A, 5B, and 5C are views for describing the manufacturing method of the vertical cavity surface emitting laser of the first embodiment of the present invention, each view describing each part of the manufacturing process succeeding to the parts of the manufacturing process of FIGS. 4A to 4C.
Figure 5B:
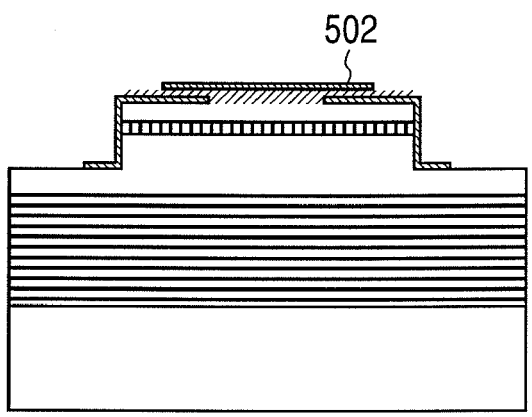
Figure 5C:
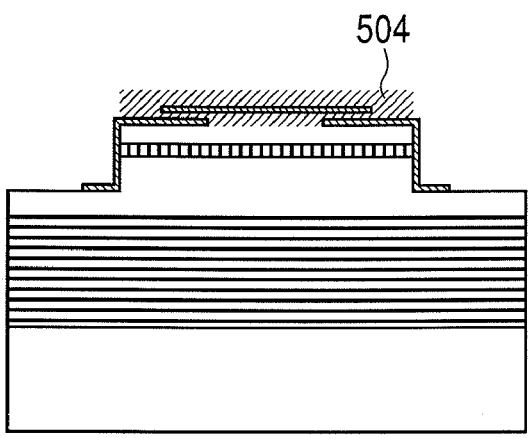

Moreover, FIGS. 5A to 5C are views for describing a part of the manufacturing process succeeding to the part of the manufacturing process of FIGS. 4A to 4C.

Figure 6A:
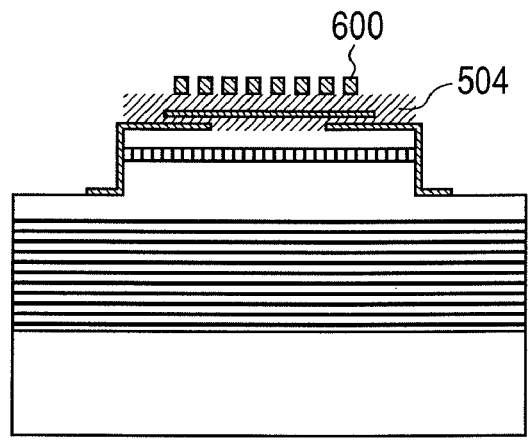
FIGS. 6A, 6B, and 6C are views for describing the manufacturing method of the vertical cavity surface emitting laser of the first embodiment of the present invention, each view illustrating each part of the manufacturing process succeeding to the parts of the manufacturing process of FIGS. 5A to 5C.
Figure 6B:
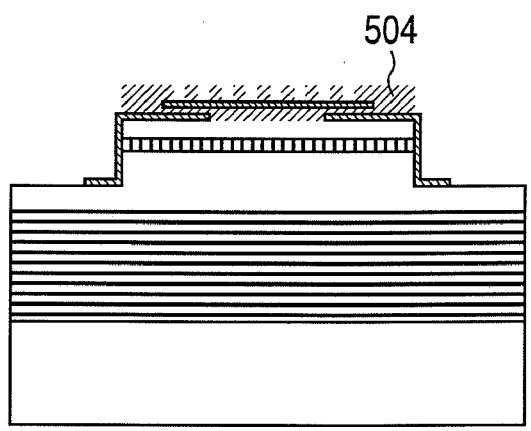
Figure 6C:
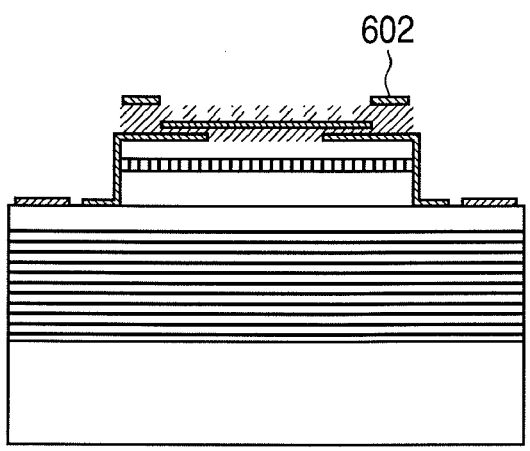

Moreover, FIGS. 6A to 6C are views for describing a part of the manufacturing process succeeding to the part of the manufacturing process of FIGS. 5A to 5C.

First, as shown in FIG. 4A, each layer is grown through a buffer layer by a metal organic chemical vapor deposition (MOCVD) apparatus on a GaN substrate 400 as follows.

An AlGaN/GaN DBR mirror layer 402, an n type GaN cladding layer 404, an InGaN/GaN MQW active layer 406, and a p type GaN/AlGaN cladding layer 408 are sequentially grown up.

In the present embodiment, a semiconductor stacked layer is configured by growing each of the aforesaid layers in such a way.

Next, a resist pattern 410 is formed on the GaN/AlGaN cladding layer 408 by means of a photolithography technique.

After that, as illustrated in FIG. 4B, a post of 20 μm in height is formed by performing dry etching by using an inductively coupled plasma (ICP) etching apparatus until the n type GaN cladding layer 404 is exposed.

Next, as illustrated in FIG. 4C, a silicon oxide layer 412 is formed as a protection layer by using a plasma CVD apparatus. After that, a current confinement structure is formed by using the photolithography technique and the etching technique.

Next, as illustrated in FIG. 5A, an ITO layer is formed by using a spattering apparatus.

After that, an ITO layer 500 is formed on the post by using the photolithography technique and the etching technique.

Next, as illustrated in FIG. 5B, a silicon oxide layer is formed by using the spattering apparatus.

After that, a silicon oxide layer 502 is formed on the ITO layer 500 formed on the post, by using the photolithography technique and the etching technique.

Next, as illustrated in FIG. 5C, an ITO layer is formed by using the spattering apparatus.

After that, an ITO layer 504 is formed to cover the silicon oxide layer 502 formed on the post, by using the photolithography technique and the etching technique.

Next, as illustrated in FIG. 6A, a resist pattern 600 is formed on the ITO layer 504 by using an electron beam lithography technique.

Next, as illustrated in FIG. 6B, the ITO layer 504 is etched by using the ICP etching apparatus. At this time, the depth of the etching is set so that the silicon oxide layer 502 is exposed.

After that, the remaining resist is removed by oxygen ashing. At this part of the process, a slab-type two dimensional photonic crystal (columnar holes in a triangular lattice arrangement) is formed.

Next, as illustrated in FIG. 6C, a Ti/Al cathode is formed on the n type GaN cladding layer 404 by using a lift-off technique.

Similarly, an Au anode 602 is formed on the ITO layer 504.

By the process described above, a vertical cavity surface emitting laser in the configuration using the DBR mirror and the slab-type two dimensional photonic crystal mirror as the reflective mirrors of a vertical resonator can be obtained.

The configuration of the present invention is especially effective to the vertical cavity surface emitting laser using a III group nitride semiconductor, the current injection into which is regarded as being difficult.

It is a matter of course that the present invention can be also applied to the vertical cavity surface emitting laser using a III-V group compound semiconductor or a II-V group compound semiconductor.

By this configuration, the vertical cavity surface emitting laser using the slab-type two dimensional photonic crystal as a mirror according to the present embodiment can form a mirror which is a single layer having higher reflectivity than that of the conventional surface emitting laser.

Moreover, because the resistance of the device can be reduced according to the present embodiment, a vertical cavity surface emitting laser having a smaller oscillation threshold value current in comparison with that of the conventional surface emitting laser can be obtained.

Although the periodicity of the columnar holes is arranged by the triangular lattice arrangement in the present embodiment, the arrangement of the periodicity is not limited to this one. The periodicity may be arranged by an arbitrary arrangement pattern, such as a tetragonal lattice and a honeycomb lattice. Moreover, the shape is not also limited to the columnar holes, but elliptic cylinder holes, square pole holes, triangle pole holes, and the like, may be used.

Moreover, an ITO layer may be used as the transparent conductive layer, and a material having conductivity, such as stannic oxide, may be used as the low refractive index material.

Moreover, the techniques (apparatus) used for growing, lithography, etching, ashing, and vapor deposition shown in the present exemplary embodiment are not limited to the described (apparatus), but any techniques (apparatus) can be used as long as they can obtain similar effects.

Second Embodiment

A vertical cavity surface emitting laser of a second embodiment of the present invention will be described.

Figure 7:
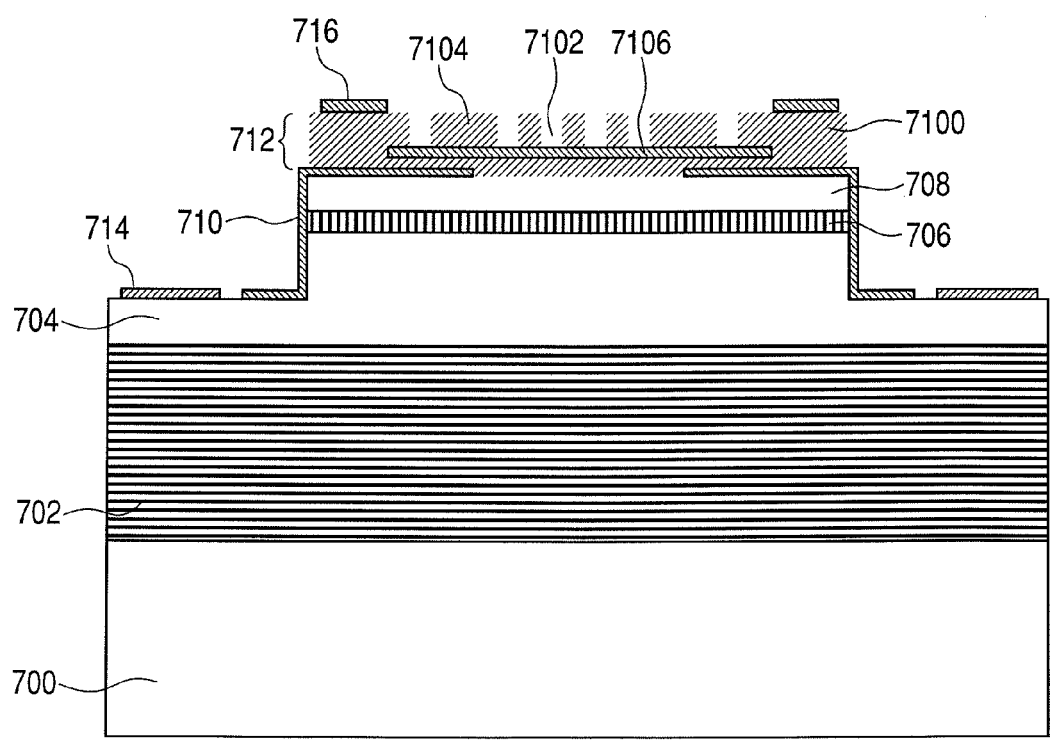
FIG. 7 is a schematic sectional view illustrating the configuration of a vertical cavity surface emitting laser of a second embodiment of the present invention.

FIG. 7 illustrates a schematic view for describing the configuration of the vertical cavity surface emitting laser of the present exemplary embodiment.

The vertical cavity surface emitting laser illustrated in FIG. 7 includes a sapphire substrate 700, an AlGaN/GaN DBR mirror 702, an n type GaN cladding layer 704, an InGaN/GaN multi quantum well (MQW) active layer 706, and a p type GaN/AlGaN cladding layer 708.

The vertical cavity surface emitting laser further includes a silicon oxide film 710, a slab-type two dimensional photonic crystal mirror 712 (including an ITO layer 7100, holes 7102, a defect 7104, and a silicon oxide layer 7106), an n side electrode 714, and a p side electrode 716.

In the present embodiment, the basic configuration of the element is similar to that of the first embodiment except for the configuration of the slab-type two dimensional photonic crystal mirror 712.

Accordingly, only the slab-type two dimensional photonic crystal mirror 712 is described with reference to FIG. 7.

The slab-type two dimensional photonic crystal mirror 712 of the present embodiment is configured so that the ITO 7100 is used as the first medium, the holes 7102 is used as second media, and the silicon oxide layer 7106 is used as the third medium, similarly to the first embodiment.

In the present embodiment, the holes (columnar holes) 7102 are arranged in a triangular lattice arrangement, and a part disturbing the periodicity of the holes 7102, the so-called defect 7104, is introduced at a part of the holes 7102.

The manufacturing method of the device of the present embodiment is almost similar to that of the first embodiment.

A different part of the process is to change the electron beam lithography pattern used at the time of forming the periodic refractive index structure in the ITO layer 7100, which is the first medium. The other parts of the process are basically similar to those of the first embodiment.

In the present embodiment, a level caused by the defect 7104 is formed in the photonic band by the introduction of the defect 7104, and a light entering the two dimensional photonic crystal mirror resonates only in the mode caused by the defect level in the two-dimensional direction. Consequently, the realization of the single mode of the light can be attained.

This single mode light is emitted into the vertical direction on the incident light side, and resonates between the two upper and lower mirrors formed to put the active layer 706 between them (at least one of the mirrors is the slab-type two dimensional photonic crystal mirror 712 including the defect 7104). Then, the vertical cavity surface emitting laser finally emits a coherent light.

At this time, a single mode light having a large spot diameter can be obtained by coupling spatially localized single mode lights.

Either of the periodically arrangement of the introduced defects and their aperiodically arrangement can be adopted as the form of the defects. In any cases, it is needed that the lights localized in the defects are within the distance enabling the lights to couple with each other, and preferably such distant may be a range from two periodicities to ten periodicities, both inclusive.

Although the defect 7104 is formed by removing a part of the holes 7102 in the present embodiment, the formation of the defect 7104 is not limited to this method. The defect may be formed by changing (to be larger or smaller) the diameters of the holes (diameters of the columnar holes).

While the present invention has been described with reference to exemplary embodiments, it is to be understood that the present invention is not limited to the disclosed exemplary embodiments. The scope of the following claims is to be accorded the broadest interpretation so as to encompass all such modifications and equivalent structures and functions.

This application claims priority from Japanese Patent Application No. 2007-122827 filed on May 7, 2007, which is hereby incorporated by reference herein.

What is claimed is:

1. A surface emitting laser comprising:
    a first reflective mirror constituting a lower mirror;
    a second reflective mirror constituting an upper mirror;
    an active layer formed between the first and the second reflective mirrors; and
    a substrate, on which the first and the second reflective mirrors and the active layer are formed, wherein the second reflective mirror has a periodic refractive index structure, in which a first medium having conductivity and second medium having a refractive index lower than that of the first medium is periodically provided in a plane parallel to a surface of the substrate,
    wherein a layer structure made of a third medium having a refractive index lower than that of the first medium is embedded in the first medium on a lower side of the periodic refractive index structure, and
    wherein the third medium is made of a material having the refractive index lower than that of the first medium by 10% or more and being transparent to a light emitted from the active layer.

2. The surface emitting laser according to claim 1, wherein each of the first medium and the second medium is made of a material transparent to a light emitted from the active layer.

3. The surface emitting laser according to claim 1, wherein the third medium is made of an insulating material.

4. The surface emitting laser according to claim 1, wherein the first medium is made of ITO.

5. The surface emitting laser according to claim 1, wherein the third medium is made of silicon oxide.

6. A surface emitting laser comprising:
    a first reflective mirror constituting a lower mirror;
    a second reflective mirror constituting an upper mirror;
    an active layer formed between the first and the second reflective mirrors; and
    a substrate, on which the first and the second reflective mirrors and the active layer are formed, wherein the second reflective mirror has a periodic refractive index structure, in which a first medium having conductivity and second medium having a refractive index lower than that of the first medium is periodically provided in a plane parallel to a surface of the substrate,
    wherein a layer structure made of a third medium having a refractive index lower than that of the first medium is embedded in the first medium on a lower side of the periodic refractive index structure,
    wherein the third medium is made of an insulating material, and
    wherein a current confinement structure is formed of an insulating material provided under the first medium and the third medium.

7. The surface emitting laser according to claim 6, wherein each of the first medium and the second medium is made of a material transparent to a light emitted from the active layer.

8. The surface emitting laser according to claim 6, wherein the third medium is made of a material having the refractive index lower than that of the first medium by 10% or more.

9. The surface emitting laser according to claim 8, wherein the third medium is made of a material transparent to a light emitted from the active layer.

10. The surface emitting laser according to claim 6, wherein the first medium is made of ITO.

11. The surface emitting laser according to claim 6, wherein the third medium is made of silicon oxide.

12. A surface emitting laser comprising:
    a first reflective mirror constituting a lower mirror;
    a second reflective mirror constituting an upper mirror;
    an active layer formed between the first and the second reflective mirrors; and
    a substrate, on which the first and the second reflective mirrors and the active layer are formed, wherein the second reflective mirror has a periodic refractive index structure, in which a first medium having conductivity and second medium having a refractive index lower than that of the first medium is periodically provided in a plane parallel to a surface of the substrate,
    wherein the periodic refractive index structure includes a part which disturbs periodicity of the periodic refractive index structure, and
    wherein a layer structure made of a third medium having a refractive index lower than that of the first medium is embedded in the first medium on a lower side of the periodic refractive index structure.

13. The surface emitting laser according to claim 12, wherein each of the first medium and the second medium is made of a material transparent to a light emitted from the active layer.

14. The surface emitting laser according to claim 12, wherein the third medium is made of a material having the refractive index lower than that of the first medium by 10% or more.

15. The surface emitting laser according to claim 14, wherein the third medium is made of a material transparent to a light emitted from the active layer.

16. The surface emitting laser according to claim 12, wherein the third medium is made of an insulating material.

17. The surface emitting laser according to claim 16, wherein a current confinement structure is formed of an insulating material provided under the first medium and the third medium.

18. The surface emitting laser according to claim 12, wherein the first medium is made of ITO.

19. The surface emitting laser according to claim 12, wherein the third medium is made of silicon oxide.

* * * * *